(12) United States Patent
Itoh

(10) Patent No.: US 11,619,870 B2
(45) Date of Patent: *Apr. 4, 2023

(54) PROJECTOR

(71) Applicant: Seiko Epson Corporation, Toyko (JP)

(72) Inventor: Yoshitaka Itoh, Matsumoto (JP)

(73) Assignee: SEIKO EPSON CORPORATION ( * ) Notice: Subject to any disclaimer, the term of this patent is extended or adjusted under 35 U.S.C. 154(b) by 0 days.

This patent is subject to a terminal disclaimer.

(21) Appl. No.: 17/327,838

(22) Filed: May 24, 2021

(65) Prior Publication Data
US 2021/0278757 A1 Sep. 9, 2021

Related U.S. Application Data

(63) Continuation of application No. 16/728,184, filed on Dec. 27, 2019, now Pat. No. 11,042,079.

(30) Foreign Application Priority Data

Dec. 28, 2018 (JP) .............................. JP2018-247172

(51) Int. Cl.
G03B 21/14 (2006.01)
H04N 9/31 (2006.01)
(Continued)

(52) U.S. Cl.
CPC ....... G03B 21/2033 (2013.01); G03B 21/005 (2013.01); H01S 5/0425 (2013.01);
(Continued)

(58) Field of Classification Search
CPC . H01S 5/22; H01S 5/26; H01S 5/0425; H01S 5/105; H04N 9/31; H04N 9/3102;
(Continued)

(56) References Cited

U.S. PATENT DOCUMENTS 6,010,221 A 1/2000 Maki et al.
6,345,895 B1 2/2002 Maki et al.
(Continued)

FOREIGN PATENT DOCUMENTS

JP H04-069642 A 3/1992
JP H11-038365 A 2/1999
(Continued)

Primary Examiner — William C. Dowling
(74) Attorney, Agent, or Firm — Harness, Dickey & Pierce, P.L.C.

(57) ABSTRACT

A projector includes a laser source, a light modulation element configured to modulate light emitted from the laser source in accordance with image information, and a light transmissive member disposed in a light path between the laser source and the light modulation element, and configured to transmit the light emitted from the laser source, wherein the laser source and the light modulation element are bonded to the light transmissive member, the laser source includes a substrate, and a laminated structure provided to the substrate, and having a light emitting layer configured to emit light, and the laminated structure constitutes a photonic crystal structure configured to confine the light emitted by the light emitting layer in an in-plane direction of the substrate, and emit the light emitted by the light emitting layer in a normal direction of the substrate.

5 Claims, 11 Drawing Sheets

(51) Int. Cl.
  *G03B 21/20* (2006.01)
  *G03B 21/00* (2006.01)
  *H01S 5/042* (2006.01)
  *H01S 5/22* (2006.01)
(52) U.S. Cl.
  CPC ............. *H01S 5/22* (2013.01); *H04N 9/3102* (2013.01); *G03B 21/2073* (2013.01)
(58) Field of Classification Search
  CPC .. H04N 9/3108; G03B 21/14; G03B 21/2033; G03B 21/2073; G03B 21/005
  See application file for complete search history.

(56) References Cited

U.S. PATENT DOCUMENTS

| | | | |
|---|---|---|---|
| 6,609,796 | B2 | 8/2003 | Maki et al. |
| 10,833,484 | B2 | 11/2020 | Nishioka et al. |
| 2002/0063853 | A1 | 5/2002 | Maki et al. |
| 2005/0162616 | A1 | 7/2005 | Gupta et al. |
| 2006/0044654 | A1 | 3/2006 | Vandorpe et al. |
| 2008/0036038 | A1* | 2/2008 | Hersee ................ H01L 21/0237 438/479 |
| 2010/0238966 | A1* | 9/2010 | Mochizuki ......... G03B 21/2066 372/99 |
| 2019/0267775 | A1 | 8/2019 | Noda et al. |
| 2020/0036163 | A1 | 1/2020 | Nishioka et al. |
| 2020/0041889 | A1 | 2/2020 | Ishizawa et al. |
| 2020/0067271 | A1* | 2/2020 | Akasaka ............. H01S 5/34333 |
| 2020/0106244 | A1 | 4/2020 | Noda et al. |
| 2020/0274330 | A1 | 8/2020 | Nagawa et al. |
| 2020/0279974 | A1 | 9/2020 | Noda et al. |
| 2020/0313038 | A1 | 10/2020 | Ishizawa et al. |
| 2020/0313039 | A1 | 10/2020 | Ishizawa et al. |
| 2020/0412100 | A1 | 12/2020 | Miyata |

FOREIGN PATENT DOCUMENTS

| | | |
|---|---|---|
| JP | 2000-131649 A | 5/2000 |
| JP | 2001-249400 A | 9/2001 |
| JP | 2008-205985 A | 9/2008 |
| JP | 2010-219307 A | 9/2010 |
| WO | 99-49358 A1 | 9/1999 |

* cited by examiner

PROJECTOR

This is a continuation patent application of U.S. application Ser. No. 16/728,184, filed Dec. 27, 2019, which is based on, and claims priority from JP Application Serial Number 2018-247172, filed Dec. 28, 2018, the disclosures of which are hereby expressly incorporated by reference herein in their entireties.

BACKGROUND

1. Technical Field

The present disclosure relates to a projector.

2. Related Art

There has been put into practical use a projector for illuminating a light modulation element such as a liquid crystal light valve with the light emitted from a light source, and then projecting the image light formed by the light modulation element on a screen or the like to thereby perform display.

In, for example, International Publication No. WO 99/49358 (Document 1), there is described a projector for making the light emitted from an LD (Laser Diode) array constituted by semiconductor lasers enter a transmissive liquid crystal panel.

However, in the projector described in Document 1, since the light emitted from the LD array is diffused, there is disposed a lens array for collimating the light emitted from the LD array between the LD array and the transmissive liquid crystal panel. Since the lens array needs to be disposed at a distance from the LD array and the transmissive liquid crystal panel, in the projector described in Document 1, it is difficult to achieve reduction in size.

SUMMARY

A projector according to an aspect of the present disclosure includes a laser source, a light modulation element configured to modulate light emitted from the laser source in accordance with image information, and a light transmissive member disposed in a light path between the laser source and the light modulation element, and configured to transmit the light emitted from the laser source, wherein the laser source and the light modulation element are bonded to the light transmissive member, the laser source includes a substrate, and a laminated structure provided to the substrate, and having a light emitting layer configured to emit light, and the laminated structure constitutes a photonic crystal structure configured to confine the light emitted by the light emitting layer in an in-plane direction of the substrate, and emit the light emitted by the light emitting layer in a normal direction of the substrate.

In the projector according to the aspect, the light transmissive member may be a radiator plate configured to radiate heat of the laser source.

In the projector according to the aspect, the light transmissive member may be a polarization element.

In the projector according to the aspect, the light transmissive member may be a polarization split element.

In the projector according to the aspect, the light transmissive member may be a total-reflection prism.

A projector according to an aspect of the present disclosure includes a laser source, and a light modulation element configured to modulate light emitted from the laser source in accordance with image information, wherein the laser source and the light modulation element are bonded to each other, the laser source includes a substrate, and a laminated structure provided to the substrate, and having a light emitting layer configured to emit light, and the laminated structure constitutes a photonic crystal structure configured to confine the light emitted by the light emitting layer in an in-plane direction of the substrate, and emit the light emitted by the light emitting layer in a normal direction of the substrate.

A projector according to an aspect of the present disclosure includes a laser source, a light modulation element configured to modulate light emitted from the laser source in accordance with image information, and a radiator plate disposed between the laser source and the light modulation element, and configured to radiate heat of the laser source, wherein the laser source and the light modulation element are bonded to the radiator plate, the radiator plate is provided with a through hole through which the light emitted from the laser source passes, the laser source includes a substrate, and a laminated structure provided to the substrate, and having a light emitting layer configured to emit light, and the laminated structure constitutes a photonic crystal structure configured to confine the light emitted by the light emitting layer in an in-plane direction of the substrate, and emit the light emitted by the light emitting layer in a normal direction of the substrate.

DESCRIPTION OF EXEMPLARY EMBODIMENTS

Some preferred embodiments of the present disclosure will hereinafter be described in detail using the accompanying drawings. It should be noted that the embodiments described below do not unreasonably limit the contents of the present disclosure as set forth in the appended claims. Further, all of the constituents described hereinafter are not necessarily essential elements of the present disclosure.

1. First Embodiment 1.1. Projector

Figure 1:
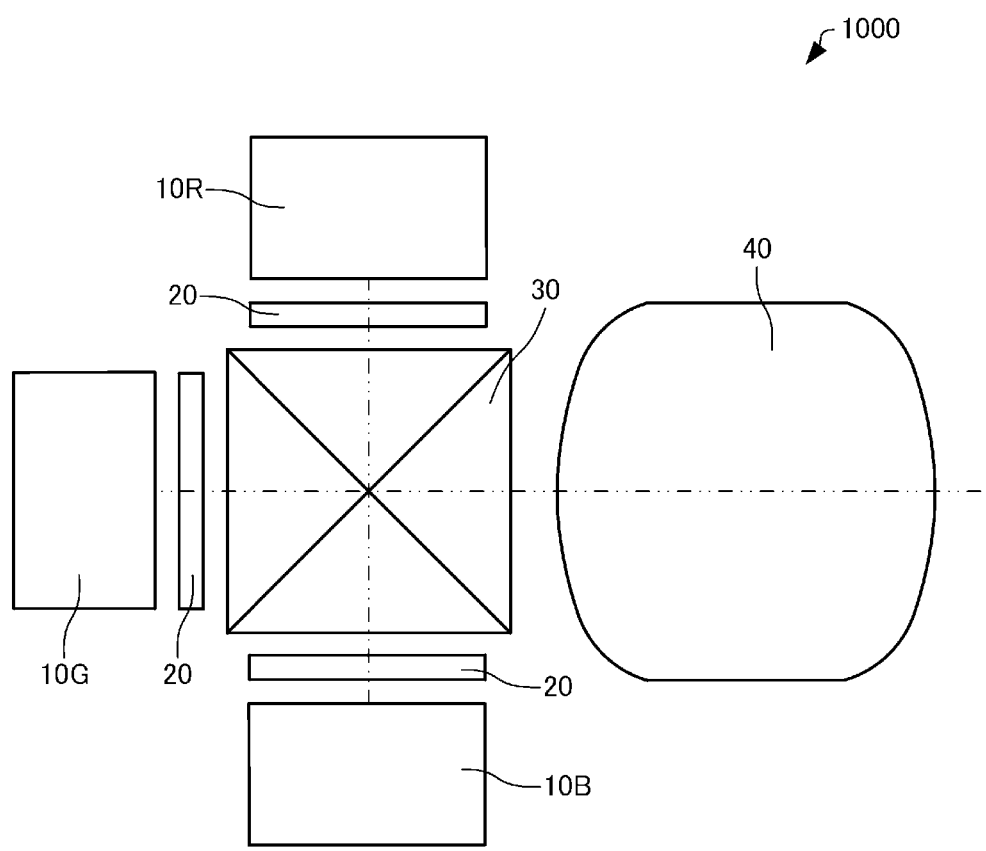
FIG. 1 is a diagram schematically showing a projector according to a first embodiment.

Firstly, a projector according to a first embodiment will be explained with reference to the accompanying drawings. FIG. 1 is a diagram schematically showing the projector 1000 according to the first embodiment.

As shown in FIG. 1, the projector 1000 has, for example, display devices 10R, 10G, and 10B, polarization elements 20, a colored light combining prism 30, and a projection lens 40. Here, FIG. 2 is a diagram schematically showing the display device 10R.

Figure 2:
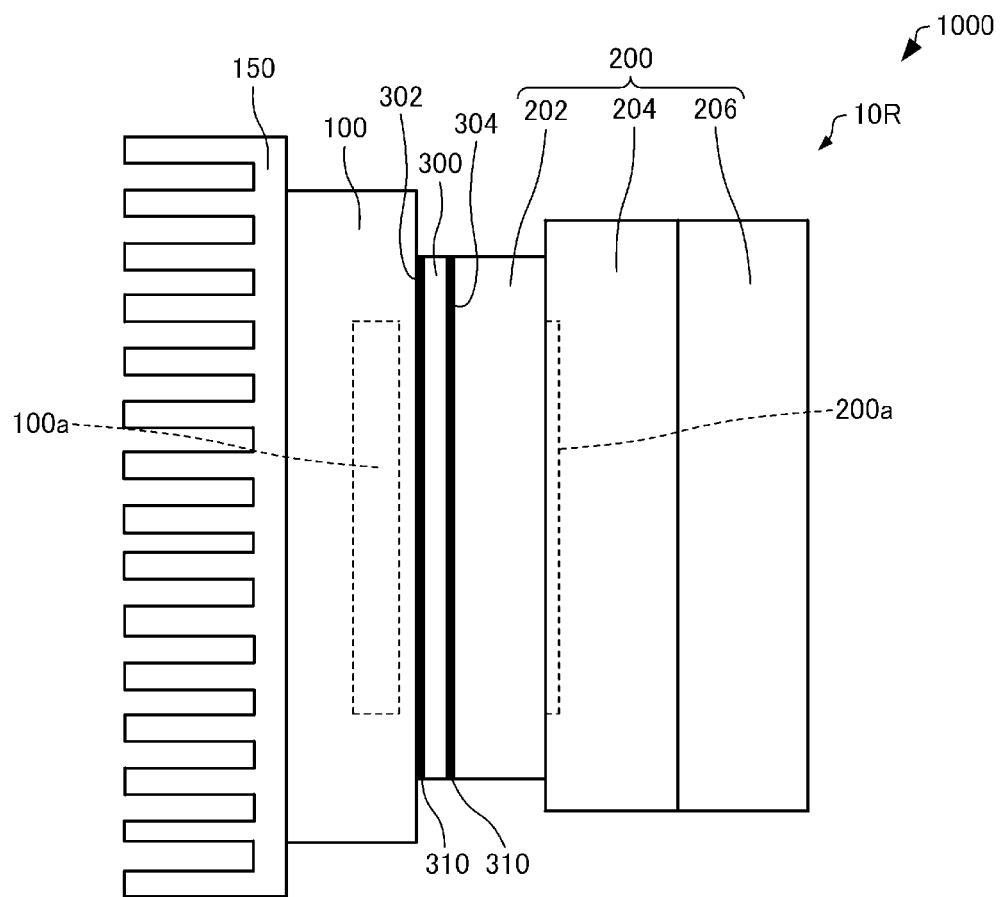
FIG. 2 is a diagram schematically showing a display device of the projector according to the first embodiment.

As shown in FIG. 2, the display device 10R has, for example, a laser source 100, a light modulation element 200, and a light transmissive member 300. It should be noted that in FIG. 2, the laser source 100 is illustrated in a simplified manner for the sake of convenience.

The laser source 100 emits a laser beam. The laser source 100 emits red light. In the illustrated example, a radiator fin 150 is coupled to the laser source 100. The radiator fin 150 radiates the heat generated in the laser source 100. Thus, it is possible to enhance the emission efficiency of the laser source 100.

The light modulation element 200 modulates the light emitted from the laser source 100 in accordance with image information. The light modulation element 200 is, for example, a transmissive liquid crystal light valve for transmitting the light emitted from the laser source 100. The projector 1000 is an LCD (liquid crystal display) projector. Here, FIG. 3 is a diagram schematically showing the light modulation element 200, and is a diagram of the light modulation element 200 viewed from the incident side of the light emitted from the laser beam 100.

Figure 3:
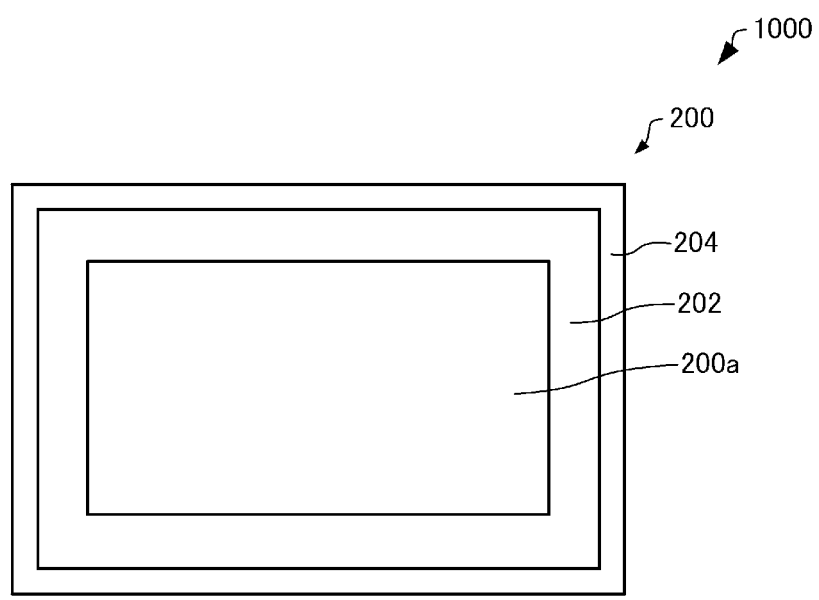
FIG. 3 is a diagram schematically showing a light modulation element of the projector according to the first embodiment.

As shown in FIG. 2 and FIG. 3, the light modulation element 200 is configured including, for example, an opposed substrate 202, a TFT (Thin Film Transistor) substrate 204, and a dust-proof substrate 206, and has a liquid crystal layer having a light modulation function between the opposed substrate 202 and the TFT substrate 204 although not shown in the drawings. In the example shown in FIG. 3, a display area 200a located in a central part and having a rectangular shape is provided, and the light having entered the display area 200a is modulated to form image light.

As shown in FIG. 2, the light transmissive member 300 is disposed in a light path of the light emitted from the laser source 100 between the laser source 100 and the light modulation element 200. In the illustrated example, the light transmissive member 300 is disposed between the laser source 100 and the light modulation element 200. The laser source 100 and the light modulation element 200 are bonded to the light transmissive member 300.

Here, "bonding" includes when coupled to each other with an adhesive, and when coupled to each other with interface bonding. In other words, the expression that "the laser source 100 and the light modulation element 200 are bonded to the light transmissive member 300" includes when the laser source 100 and the light modulation element 200 are coupled to the light transmissive member 300 with an adhesive, and when the laser source 100 and the light modulation element 200 is coupled to the light transmissive member 300 with the interface bonding. The "interface bonding" is to make the interfaces smooth and clean to have contact with each other to thereby be coupled to each other with atoms diffused across the interfaces having contact with each other.

In the illustrated example, the laser source 100 and the light modulation element 200 are coupled to the light transmissive member 300 with an adhesive 310. The adhesive 310 transmits the light emitted from the laser source 100. It is preferable for the refractive index of the adhesive 310 to be close to the refractive index of a member having contact with the adhesive 310 of the laser source 100, the refractive index of a member having contact with the adhesive 310 of the light modulation element 200, and the refractive index of a member having contact with the adhesive 310 of the light transmissive member 300. Thus, it is possible to reduce the light loss generated on the interface between the adhesive 310 and the member having contact with the adhesive 310. As the adhesive 310, it is possible to use, for example, an epoxy adhesive (the refractive index of about 1.55 through 1.65) and a silicone adhesive (the refractive index of about 1.40 through 1.47).

It is also possible for the adhesive 310 to include a metal filler. Thus, it is possible to increase the thermal conductivity of the adhesive 310, and thus, it is possible to efficiently radiate the heat generated in the laser source 100. It should be noted that the adhesive 310 for coupling the laser source 100 and the light transmissive member 300 to each other and the adhesive 310 for coupling the light modulation element 200 and the light transmissive member 300 to each other can be the same in type, or can also be different in type from each other.

The light transmissive member 300 has a first surface 302 and a second surface 304. The laser source 100 is bonded to the first surface 302. Specifically, a second electrode 124 of the laser source 100 shown in FIG. 4 described later is bonded to the first surface 302. As shown in FIG. 2, the light modulation element 200 is bonded to the second surface 304. Specifically, the opposed substrate 202 of the light modulation element 200 is bonded to the second surface 304. In the illustrated example, the first surface 302 and the second surface 304 face to directions opposite to each other.

The light transmissive member 300 is, for example, a polarization element. The polarization element adjusts the polarization direction of the light emitted from the laser source 100. Specifically, the polarization element is an optical element for transmitting only the linearly polarized light in a specific direction. Therefore, when the light emitted from the laser source 100 has a polarized nature, it is desirable to dispose the polarization element so that the polarizing axis of the emitted light and the transmission axis of the polarization element coincide with each other. It is possible to uniform the polarization direction of the light emitted from the laser source 100 due to the polarization element. As the polarization element, it is possible to use, for example, a polarization element of an inorganic type such as a wire grid polarizer, and a polarization element of an organic type such as a film polarizer using a stretch orientation film. When adopting a resin film-base polarizer, it is also possible to use the polarizer directly, but it is possible to more firmly and more stably fix the laser source 100 and the light modulation element 200 when using the polarizer stuck to a substrate made of sapphire, glass, or the like. It should be noted that the polarization element of the inorganic type is preferable taking the heat resistance and the light resistance into consideration.

The display devices 10G, 10B shown in FIG. 1 each have the laser source 100, the light modulation element 200, and the light transmissive member 300 similarly to the display device 10R. It should be noted that the laser source 100 of the display device 10G emits the green light. Further, the laser source 100 of the display device 10B emits the blue light.

As shown in FIG. 1, the polarization elements 20 are respectively disposed between the display device 10R and the colored light combining prism 30, between the display device 10G and the colored light combining prism 30, and between the display device 10B and the colored light combining prism 30. The polarization elements 20 function as analyzers with respect to the light emitted from the display devices 10R, 10B, and 10B. The light emitted from the polarization elements 20 enters the colored light combining prism 30.

The colored light combining prism 30 combines the light emitted from the display device 10R, the light emitted from the display device 10G, and the light emitted from the display device 10B with each other. The colored light combining prism 30 is, for example, a cross dichroic prism which is formed by bonding four rectangular prisms to each other, and is provided with a dielectric multilayer film for reflecting the red light and a dielectric multilayer film for reflecting the blue light disposed on the inside surfaces thereof so as to form a crisscross.

The projection lens 40 projects the light combined by the colored light combining prism 30 on a screen not shown. An image enlarged is displayed on the screen.

Figure 4:
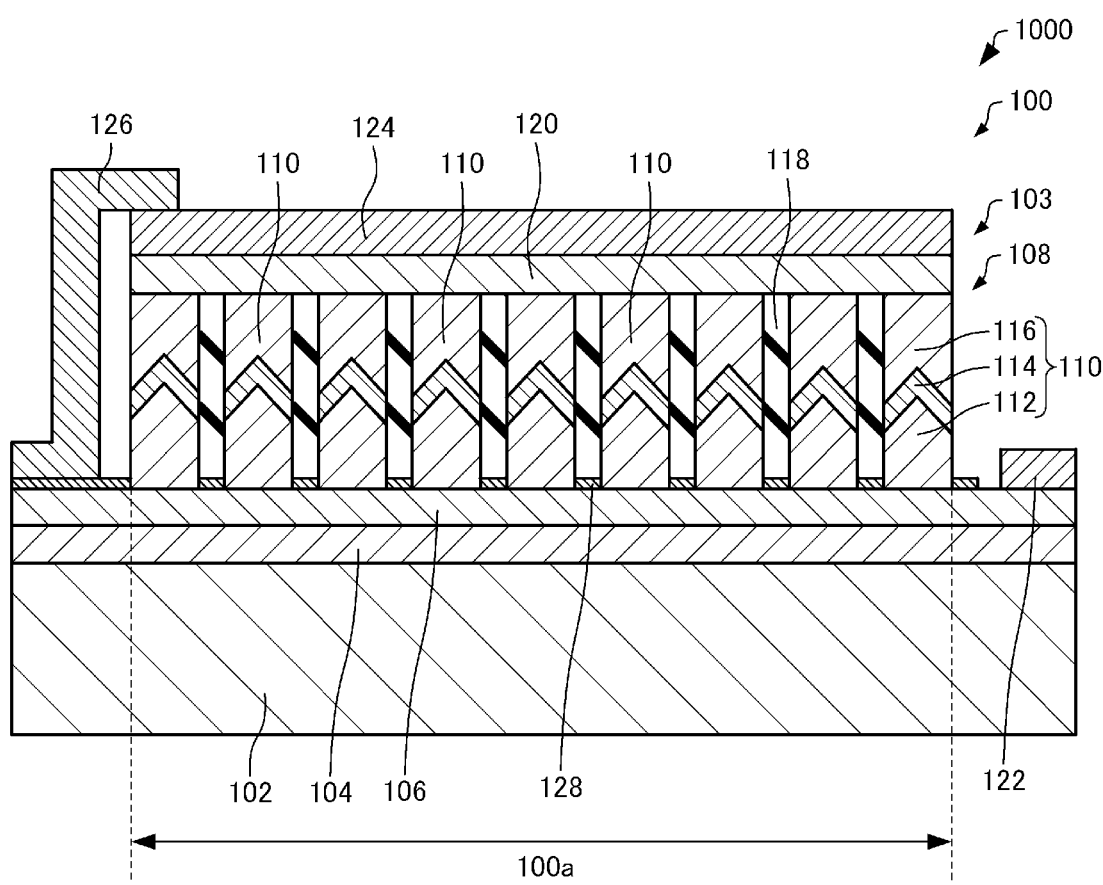
FIG. 4 is a diagram schematically showing a laser source of the projector according to the first embodiment.

Then, a configuration of the laser source 100 will be described. FIG. 4 is a cross-sectional view schematically showing the laser source 100. As shown in FIG. 4, the laser source 100 has, for example, a substrate 102, a laminated structure 103 disposed on the substrate 102, a first electrode 122, a second electrode 124, and an interconnection 126. The laminated structure 103 has a reflecting layer 104, a buffer layer 106, a photonic crystal structure 108, and a semiconductor layer 120.

The substrate 102 is, for example, an Si substrate, a GaN substrate, or a sapphire substrate.

The reflecting layer 104 is disposed on the substrate 102. The reflecting layer 104 is, for example, a DBR (distributed Bragg reflector) layer. The reflecting layer 104 is, for example, what is obtained by alternately stacking AlGaN layers and GaN layers on one another or what is obtained by alternately stacking AlInN layers and GaN layers on one another. The reflecting layer 104 reflects the light generated by a light emitting layer 114 of each of columnar parts 110 of the photonic crystal structure 108 toward the second electrode 124.

It should be noted that "upward" denotes a direction of getting away from the substrate 102 viewed from the light emitting layer 114 in a stacking direction (hereinafter also referred to simply as the "stacking direction") of a semiconductor layer 112 and the light emitting layer 114 in each of the columnar parts 110, and "downward" denotes a direction of getting closer to the substrate 102 viewed from the light emitting layer 114 in the stacking direction.

The buffer layer 106 is disposed on the reflecting layer 104. The buffer layer 106 is a layer made of semiconductor such as an Si-doped n-type GaN layer. In the illustrated example, on the buffer layer 106, there is disposed a mask layer 128 for growing the columnar parts 110. The mask layer 128 is, for example, a silicon oxide layer or a silicon nitride layer.

The photonic crystal structure 108 is disposed on the buffer layer 106. The photonic crystal structure 108 has the columnar parts 110 and light propagation layers 118. The laminated structure 103 constitutes the photonic crystal structure 108. In the illustrated example, the columnar parts 110 and the light propagation layers 118 of the laminated structure 103 constitute the photonic crystal structure 108.

The photonic crystal structure 108 can develop an effect of the photonic crystal, and the light emitted by the light emitting layers 114 of the photonic crystal structure 108 is confined in an in-plane direction of the substrate 102, and is emitted in a normal direction of the substrate 102. Here, the "in-plane direction of the substrate 102" denotes a direction perpendicular to the stacking direction. The "normal direction of the substrate 102" denotes the stacking direction. The laser source 100 is a photonic crystal laser having the photonic crystal structure 108.

The columnar parts 110 are disposed on the buffer layer 106. A planar shape of the columnar part 110 is a polygonal shape such as a regular hexagon, a circle, or the like. The diametrical size of the columnar part 110 is, for example, in an nm-order range, and is specifically no smaller than 10 nm and no larger than 500 nm. The size in the stacking direction of the columnar part 110 is, for example, no smaller than 0.1 μm and no larger than 5 μm.

It should be noted that when the planar shape of the columnar part 110 is a circle, the "diametrical size" denotes the diameter of the circle, and when the planar shape of the columnar part 110 is a polygon, the "diametrical size" denotes the diameter of the minimum circle including the polygon inside, namely the minimum enclosing circle. Further, the "planar shape" denotes a shape viewed from the stacking direction.

The number of the columnar parts 110 disposed is more than one. An interval between the columnar parts 110 adjacent to each other is, for example, no smaller than 1 nm and no larger than 500 nm. The columnar parts 110 are periodically disposed in a predetermined direction at a predetermined pitch. The plurality of columnar parts 110 is disposed so as to form, for example, a triangular grid or a quadrangular grid when viewed from the stacking direction.

The columnar parts 110 each have the semiconductor layer 112, the light emitting layer 114, and a semiconductor layer 116.

The semiconductor layer 112 is disposed on the buffer layer 106. The semiconductor layer 112 is, for example, the Si-doped n-type GaN layer.

The light emitting layer 114 is disposed on the semiconductor layer 112. The light emitting layer 114 is disposed between the semiconductor layer 112 and the semiconductor layer 116. The light emitting layer 114 has a quantum well structure constituted by, for example, a GaN layer and an InGaN layer. The light emitting layer 114 is a layer capable of emitting light in response to injection of an electrical current.

The semiconductor layer 116 is disposed on the light emitting layer 114. The semiconductor layer 116 is a layer different in conductivity type from the semiconductor layer 112. The semiconductor layer 116 is, for example, an Mg-doped p-type GaN layer. The semiconductor layers 112, 116 are cladding layers having a function of confining the light in the light emitting layer 114.

The light propagation layers 118 are each disposed between the columnar parts 110 adjacent to each other. In the illustrated example, the light propagation layers 118 are disposed on the mask layer 128. The refractive index of the light propagation layer 118 is lower than, for example, the refractive index of the light emitting layer 114. The light propagation layer 118 is, for example, a silicon oxide layer, an aluminum oxide layer, or a titanium oxide layer. The light generated in the light emitting layer 114 can propagate through the light propagation layer 118.

In the laser source 100, the p-type semiconductor layer 116, the light emitting layer 114 with no impurity doped, and the n-type semiconductor layer 112 constitute a pin diode. The semiconductor layers 112, 116 are layers larger in bandgap than the light emitting layer 114. In the laser source 100, when applying a forward bias voltage of the pin diode between the first electrode 122 and the second electrode 124 to inject a current, there occurs recombination of electrons and holes in the light emitting layer 114. The recombination causes light emission. The light generated in the light emitting layer 114 propagates through the light propagation layer 118 in the in-plane direction of the substrate 102 due to the semiconductor layers 112, 116 to form a standing wave due to the effect of the photonic crystal in the photonic crystal structure 108, and is confined in the in-plane direction of the substrate 102. The light thus confined causes laser oscillation with the gain in the light emitting layer 114. In other words, the light generated in the light emitting layer 114 oscillates in the in-plane direction of the substrate 102 due to the photonic crystal structure 108 to cause the laser oscillation. Then, positive first-order diffracted light and negative first-order diffracted light proceed in the stacking direction as a laser beam.

The laser beam proceeding toward the reflecting layer 104 out of the laser beam having proceeded in the stacking direction is reflected by the reflecting layer 104, and proceeds toward the second electrode 124. Thus, it is possible for the laser source 100 to emit the light from the second electrode 124 side.

The radiation angle of the light emitted from the laser source 100 is smaller than 2°, and is smaller compared to, for example, an edge-emission type semiconductor laser and a VCSEL (Vertical Cavity Surface Emitting Laser). Further, even when, for example, there is a defect in one columnar part 110, since the standing wave is formed in a direction perpendicular to the stacking direction, it is possible to compensate for the defect to emit the light high in uniformity of the intensity.

The semiconductor layer 120 is disposed on the photonic crystal structure 108. The semiconductor layer 120 is, for example, an Mg-doped p-type GaN layer.

The first electrode 122 is disposed on the buffer layer 106. It is also possible for the buffer layer 106 to have ohmic contact with the first electrode 122. In the illustrated example, the first electrode 122 is electrically coupled to the semiconductor layer 112 via the buffer layer 106. The first electrode 122 is one of the electrodes for injecting the current into the light emitting layer 114. As the first electrode 122, there can be used, for example, what is obtained by stacking a Ti layer, an Al layer, and an Au layer in this order from the buffer layer 106 side.

The second electrode 124 is disposed on the semiconductor layer 120. It is also possible for the semiconductor layer 120 to have ohmic contact with the second electrode 124. The second electrode 124 is electrically coupled to the semiconductor layer 116. In the illustrated example, the second electrode 124 is electrically coupled to the semiconductor layer 116 via the semiconductor layer 120. The second electrode 124 is the other of the electrodes for injecting the current into the light emitting layer 114. As the second electrode 124, for example, ITO (Indium Tin Oxide) is used.

The interconnection 126 is coupled to the second electrode 124. The interconnection 126 is electrically separated from the buffer layer 106. The material of the interconnection 126 is, for example, copper, aluminum, or gold.

It should be noted that although the light emitting layer 114 of the InGaN type is described above, any types of material capable of emitting light in response to an electrical current injected in accordance with the wavelength of the light emitted can be used as the light emitting layer 114. It is possible to use semiconductor materials such as an AlGaN type, an AlGaAs type, an InGaAs type, an InGaNAsP type, an InP type, a GaP type or an AlGaP type. Further, it is also possible to change the size and the pitch of the arrangement of the columnar parts 110 in accordance with the wavelength of the light emitted.

Further, although the photonic crystal structure 108 has the columnar parts 110 disposed periodically in the above description, it is also possible to have hole parts disposed periodically in order to develop the photonic crystal effect.

Here, as shown in FIG. 2, it is also possible for the shape of the light emitting section 100a of the laser source 100 and the shape of the display area 200a of the light modulation element 200 to be substantially the same when viewed from the proceeding direction of the light emitted from the laser source 100. It is also possible for the shape of the light emitting section 100a and the shape of the display area 200a to be the same. It is also possible for the size of the light emitting section 100a and the size of the display area 200a to be substantially the same. It is also possible for the size of the light emitting section 100a and the size of the display area 200a to be the same. It should be noted that the light emitting section 100a is a part for emitting light, and when the laser source 100 is a photonic crystal laser provided with the columnar parts 110 each having the light emitting layer 114, the light emitting section 100a is the photonic crystal structure 108. Further, the "proceeding direction of the light" corresponds to the stacking direction.

Then, a method of manufacturing the laser source 100 will be described.

As shown in FIG. 4, the reflecting layer 104 and the buffer layer 106 are grown epitaxially in this order on the substrate 102. As the method of growing the layer epitaxially, there can be cited, for example, an MOCVD (Metal Organic Chemical Vapor Deposition) method and an MBE (Molecular Beam Epitaxy) method.

Then, the mask layer 128 is formed on the buffer layer 106 using the MOCVD method or the MBE method. Then, the semiconductor layer 112, the light emitting layer 114, and the semiconductor layer 116 are grown epitaxally in this order on the buffer layer 106 using the mask layer 128 as a mask. As the method of growing the layers epitaxially, there can be cited, for example, the MOCVD method and the MBE method. Due to the present process, it is possible to form the columnar parts 110. Then, the light propagation layer 118 is formed between the columnar parts 110 adjacent to each other using a spin coat method or the like. Due to the present process, it is possible to form the photonic crystal structure 108.

Then, the semiconductor layer 120 is formed on the columnar parts 110 and the light propagation layer 118 using, for example, the MOCVD method or the MBE method.

Subsequently, the first electrode 122 and the second electrode 124 are formed using, for example, a vacuum evaporation method. Then, the interconnection 126 is formed using, for example, a sputtering method or a plating method.

Due to the process described hereinabove, it is possible to form the laser source 100.

The projector 1000 has, for example, the following features.

In the projector 1000, the light transmissive member 300 for transmitting the light emitted from the laser source 100 is disposed in the light path between the laser source 100 and the light modulation element 200, and the laser source 100 and the light modulation element 200 are bonded to the light transmissive member 300. Therefore, in the projector 1000, it is possible to make the distance between the laser source 100 and the light modulation element 200 smaller to thereby achieve reduction in size compared to when the laser source and the light transmissive member are separated from each other, and at the same time, the light modulation element and the light transmissive member are separated from each other. Further, reduction in weight can be achieved. In the projector 1000, since the laminated structure 103 constitutes the photonic crystal structure 108 which confines the light emitted by the light emitting layer 114 in the in-plane direction of the substrate 102 and emits the light in the normal direction of the substrate 102, the light emitted from the laser source 100 is small in radiation angle and high in uniformity of intensity as described above. Therefore, since it is not required to dispose a collimating lens for collimating the light emitted and a fly-eye lens for enhancing the uniformity of the intensity, it is possible to bond the laser source 100 and the light modulation element 200 to the light transmissive member 300.

Further, in the projector 1000, since there is no need to dispose a lens array such as a fly-eye lens, it is possible to efficiently illuminate the light modulation element 200. When the lens array is disposed, taking a shape error of the lens, an optical aberration generated in the lens, and an arrangement error of the lens array into consideration, the light modulation element is usually illuminated with light having a larger cross-sectional size compared to the display area of the light modulation element. In this case, since it results in that the light entering an area outside the display area of the light modulation element is generated, the use efficiency of the light is low. In the projector 1000, since it is possible to dispose the laser source 100 and the light modulation element 200 closely to each other, and further it is not required to dispose the lens array, it is possible to make the size of the light emitting section 100a close to the size of the display area 200a to thereby efficiently illuminate the light modulation element 200. As a result, an increase in luminance can be achieved. Further, reduction in size can be achieved.

Further, in the projector 1000, since the laser source 100 and the light modulation element 200 are bonded to the light transmissive member 300, alignment accuracy between the laser source 100 and the light modulation element 200 is high.

In the projector 1000, the light transmissive member 300 disposed in the light path between the laser source 100 and the light modulation element 200 is a polarization element. Since a lens such as an lens array is not disposed between the laser source 100 and the light modulation element 200, it is possible to achieve the reduction in size, and further, it is possible to adjust the polarization direction and the polarization degree of the light emitted from the laser source 100.

It should be noted that although not shown in the drawings, the light transmissive member 300 can be a phase compensation element, for example, for conversing elliptically-polarized light into linearly-polarized light, or can also have both of the phase compensation element and the polarization element.

1.2. Modified Examples

1.2.1. First Modified Example

Figure 5:
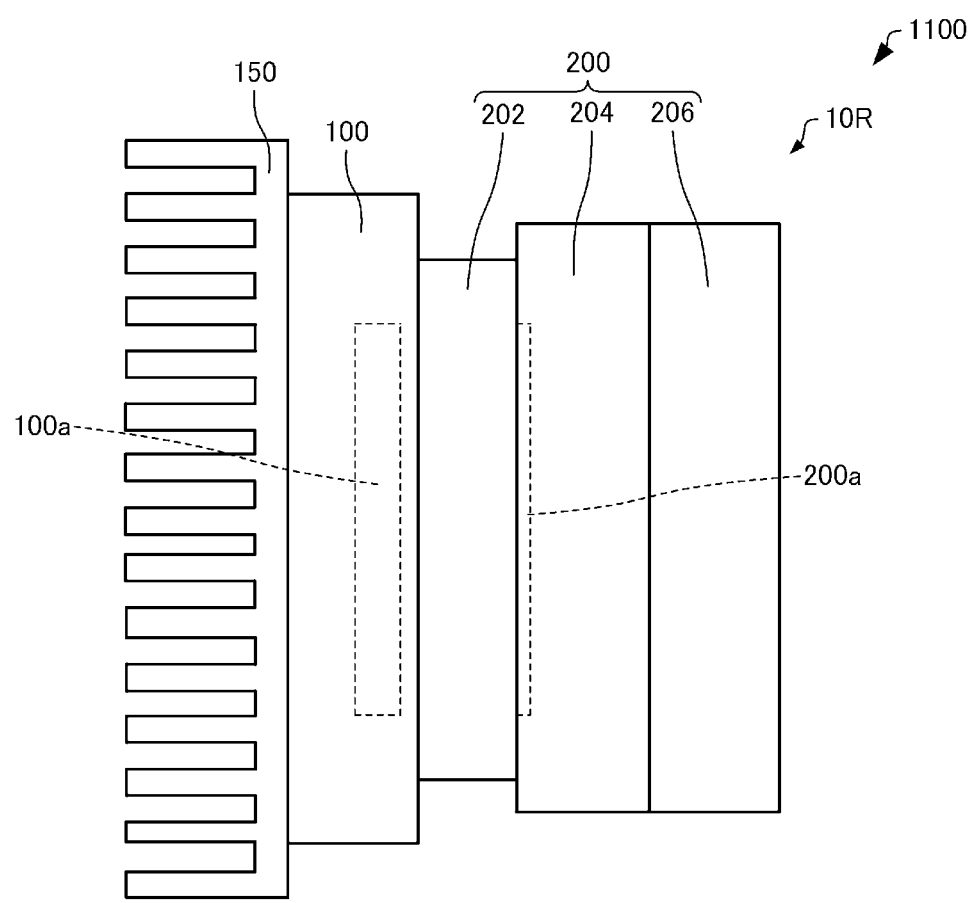
FIG. 5 is a diagram schematically showing a display device of a projector according to a first modified example of the first embodiment.

Then, a projector 1100 according to a first modified example of the first embodiment will be described with reference to the accompanying drawings. FIG. 5 is a diagram schematically showing a display device 10R of the projector 1100 according to the first modified example of the first embodiment.

Hereinafter, in the projector 1100 according to the first modified example of the first embodiment, the points in which the projector 1100 is different from the projector 1000 according to the first embodiment described above will be described, and the description of the points in which the projectors are substantially the same will be omitted. This similarly applies to second through fifth modified examples described later related to the first embodiment.

In the projector 1000 described above, the laser source 100 and the light modulation element 200 are bonded to the light transmissive member 300 disposed in the light path between the laser source 100 and the light transmissive element 200 as shown in FIG. 2.

In contrast, in the projector 1100, the laser source 100 and the light modulation element 200 are bonded to each other as shown in FIG. 5. In the illustrated example, the laser source 100 and the light modulation element 200 are coupled to each other with the interface bonding. It should be noted that although not shown in the drawings, the laser source 100 and the light modulation element 200 can also be coupled to each other with an adhesive.

In the projector 1100, the laser source 100 and the light modulation element 200 are bonded to each other. Therefore, it is possible to achieve reduction in size compared to when, for example, an optical component such as a polarization element is disposed between the laser source 100 and the light modulation element 200. Further, since the distance between the laser source 100 and the light modulation element 200 is reduced, the spread of the light emitted from the laser source 100 becomes smaller in the stage in which the light emitted from the laser source 100 enter the liquid crystal layer of the light modulation element 200, and thus, it is possible to efficiently illuminate the light modulation element 200. It should be noted that when the light emitted from the laser source 100 has a high polarization degree (linear polarization degree), it is not required to dispose the polarization element on the incident side of the light modulation element 200. Therefore, in such a case, the present configuration is preferable.

It should be noted that the light modulation element 200 can also be a transmissive liquid crystal light valve of a so-called in-cell type provided with a polarization element inside. In this case, an inorganic type polarization element is preferably used as the polarization element.

1.2.2. Second Modified Example

Figure 6:
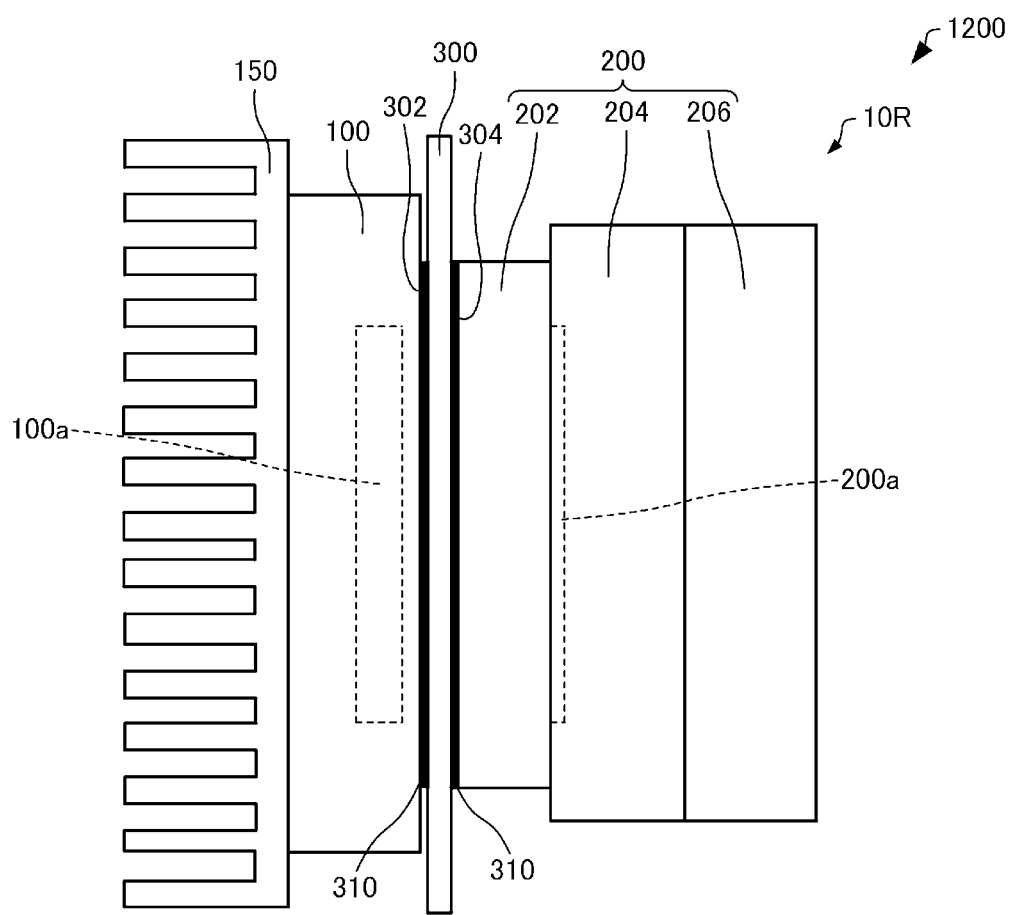
FIG. 6 is a diagram schematically showing a display device of a projector according to a second modified example of the first embodiment.

Then, a projector 1200 according to a second modified example of the first embodiment will be described with reference to the accompanying drawing. FIG. 6 is a diagram schematically showing a display device 10R of the projector 1200 according to the second modified example of the first embodiment.

In the projector 1000 described above, the light transmissive member 300 is the polarization element as shown in FIG. 2.

In contrast, in the projector 1200, the light transmissive member 300 is a radiator plate as shown in FIG. 6. The radiator plate radiates the heat generated in the laser source 100. The thermal conductivity of the radiator plate is higher than the thermal conductivity of a member to be bonded to the second surface 304. Specifically, the thermal conductivity of the radiator plate is higher than the thermal conductivity of the opposed substrate 202. The material of the radiator plate is, for example, sapphire. It should be noted that although not shown in the drawing, it is also possible for the radiator plate to be coupled to the radiator fin 150, other radiator fins, or the like.

It is preferable for the thermal expansion coefficient of the light transmissive member 300 as the radiator plate to be close to the thermal expansion coefficient of the second electrode 124 of the laser source 100, and the thermal expansion coefficient of the opposed substrate 202. Thus, it is possible to weaken the stress generated in the laser source 100 and the light modulation element 200 due to a difference in thermal expansion coefficient.

In the projector 1200, the light transmissive member 300 disposed in the light path between the laser source 100 and the light modulation element 200 is a radiator plate. Since no lens is disposed between the laser source 100 and the light modulation element 200, it is possible to achieve the reduction in size. Further, since it is possible to radiate the heat generated in the laser source 100 with the radiator plate, it is possible to increase the emission efficiency of the laser source 100.

1.2.3. Third Modified Example

Figure 7:
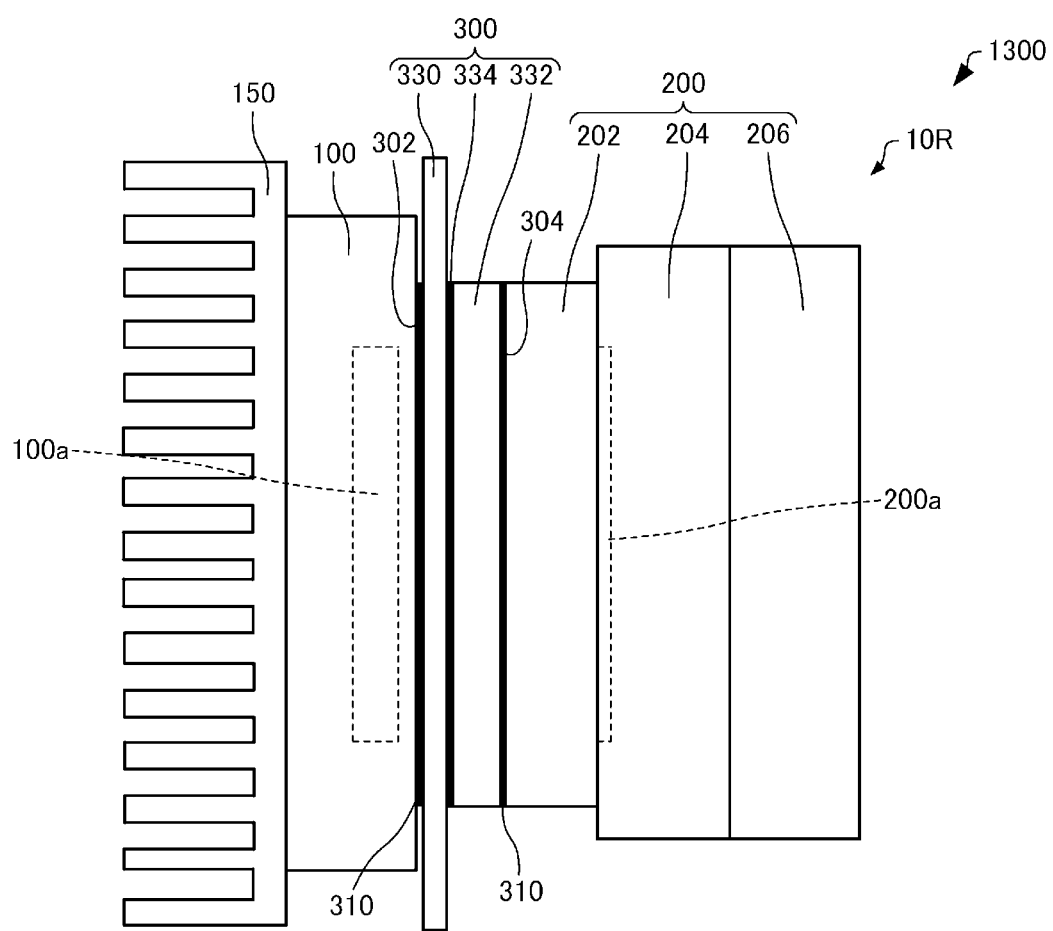
FIG. 7 is a diagram schematically showing a display device of a projector according to a third modified example of the first embodiment.

Then, a projector 1300 according to a third modified example of the first embodiment will be described with reference to the accompanying drawing. FIG. 7 is a diagram schematically showing a display device 10R of the projector 1300 according to the third modified example of the first embodiment.

In the projector 1000 described above, the light transmissive member 300 is the polarization element as shown in FIG. 2.

In contrast, in the projector 1300, the light transmissive member 300 includes a radiator plate 330 and a polarization element 332 as shown in FIG. 7.

The radiator plate 330 has a first surface 302, and is bonded to the laser source 100. The polarization element 332 has a second surface 304, and is bonded to the light modulation element 200. The radiator plate 330 and the polarization element 332 are bonded to each other. In the illustrated example, the light transmissive member 300 has an adhesive 334, and the radiator plate 330 and the polarization element 332 are coupled to each other with the adhesive 334. The material of the adhesive 334 is the same as, for example, the adhesive 310 described above.

The radiator plate 330 radiates the heat generated in the laser source 100 similarly to the radiator plate as the light transmissive member 300 described in "1.2.2. Second Modified Example" described above. The polarization element 332 adjusts the polarization direction and the polarization degree of the light emitted from the laser source 100 similarly to the polarization element as the light transmissive member 300 described in "1.1. Projector" described above.

It should be noted that it is possible for the light transmissive member 300 to have the polarization element 332 on the laser source 100 side, and have the radiator plate 330 on the light modulation element 200 side, but it is preferable to have the radiator plate 330 on the laser source 100 side as shown in FIG. 7 from the viewpoint of heat radiation properties. Further, although not shown in the drawing, it is also possible for the radiator plate 330 to be coupled to the radiator fin 150, other radiator fins, or the like.

1.2.4. Fourth Modified Example

Figure 8:
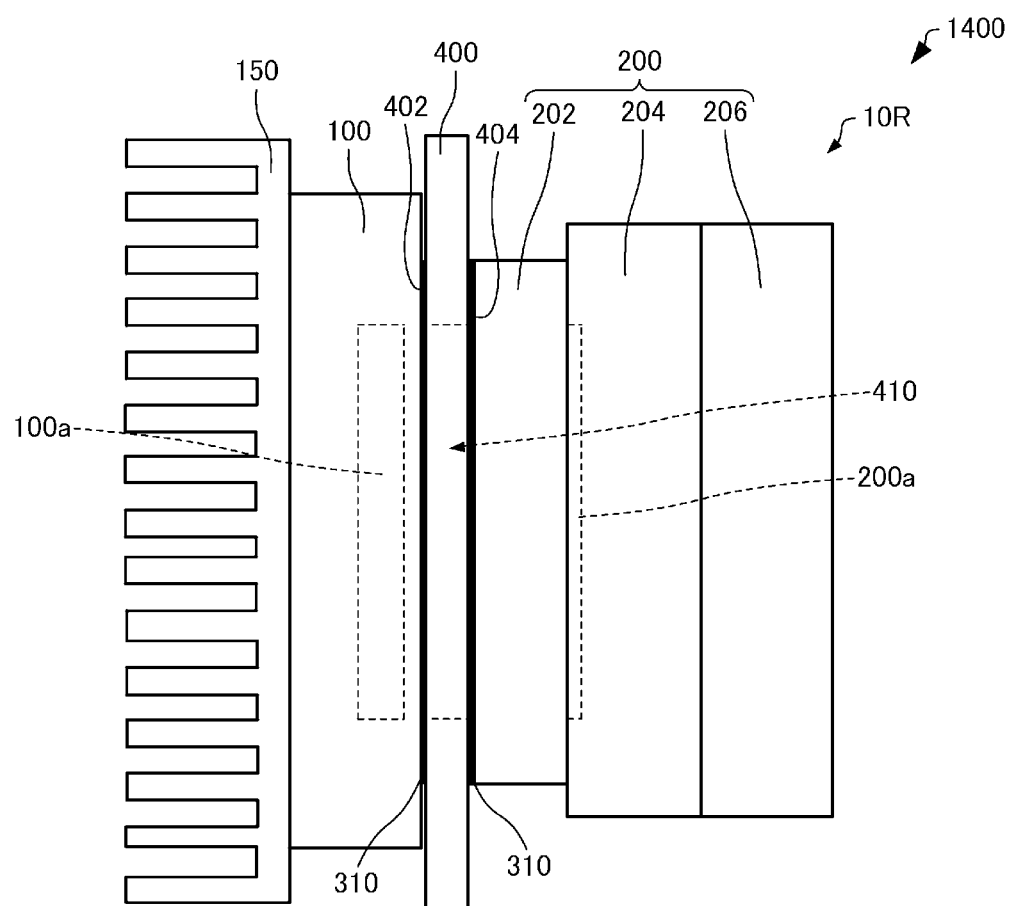
FIG. 8 is a diagram schematically showing a display device of a projector according to a fourth modified example of the first embodiment.
Figure 9:
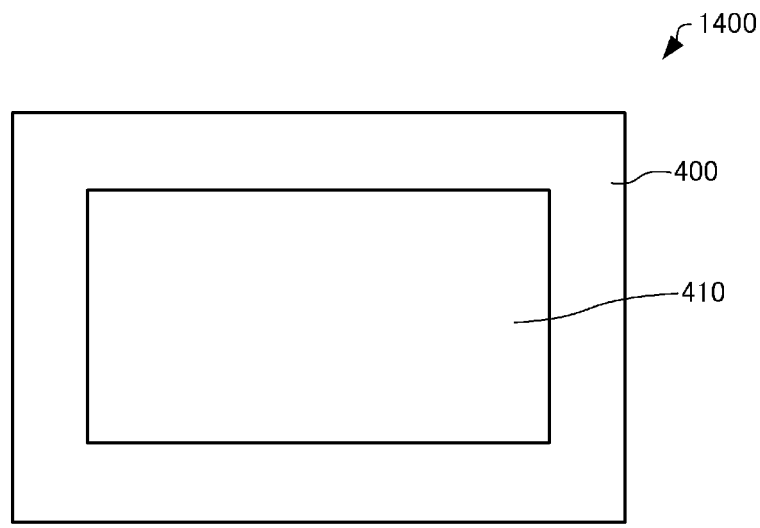
FIG. 9 is a diagram schematically showing a light modulation element of a projector according to a fourth modified example of the first embodiment.

Then, a projector 1400 according to a fourth modified example of the first embodiment will be described with reference to the accompanying drawings. FIG. 8 is a diagram schematically showing a display device 10R of the projector 1400 according to the fourth modified example of the first embodiment. FIG. 9 is a diagram schematically showing a radiator plate 400 of the projector 1400 according to the fourth modified example of the first embodiment, and is a diagram viewed from the a proceeding direction of the light emitted from the laser source 100.

The projector 1000 described above has the light transmissive member 300 as shown in FIG. 2. In contrast, the projector 1400 has the radiator plate 400 as shown in FIG. 8 and FIG. 9.

The radiator plate 400 is disposed between the laser source 100 and the light modulation element 200. The radiator plate 400 radiates the heat generated in the laser source 100. The laser source 100 and the light modulation element 200 are bonded to the radiator plate 400.

The radiator plate 400 has a first surface 402 and a second surface 404. The laser source 100 is bonded to the first surface 402. The light modulation element 200 is bonded to the second surface 404. In the illustrated example, the first surface 402 and the second surface 404 face to directions opposite to each other.

The radiator plate 400 is provided a through hole 410 through which the light emitted from the laser source 100 passes. In the example shown in FIG. 9, the radiator plate 400 has a frame-like shape. The radiator plate 400 can also be bonded to an area other than the light emitting section 100a of the laser source 100 when viewed from the proceeding direction of the light emitted from the laser source 100.

The material of the radiator plate 400 is, for example, kovar or copper. Alternatively, as the radiator plate 400, there can be used what is obtained by using a copper plate on the laser source 100 side and a kovar plate on the light modulation element 200 side. Since the thermal expansion coefficient around the room temperature of kovar is relatively small among metals, and is close to the thermal expansion coefficient of hard glass or ceramics, it is possible to weaken the stress caused by a difference in thermal expansion coefficient between the radiator plate 400 and the opposed substrate 202. Further, copper is higher in thermal expansion coefficient compared to kovar, and can therefore efficiently radiate the heat generated in the laser source 100.

In the projector 1400, the radiator plate 400 is provided the through hole 410 through which the light emitted from the laser source 100 passes. Therefore, it is possible to radiate heat generated in the laser source 100 while preventing the light emitted from the laser source 100 from being absorbed in the radiator plate 400. It should be noted that although not shown in the drawing, it is also possible for the radiator plate 400 to be coupled to the radiator fin 150, other radiator fins, or the like.

1.2.5. Fifth Modified Example

Figure 10:
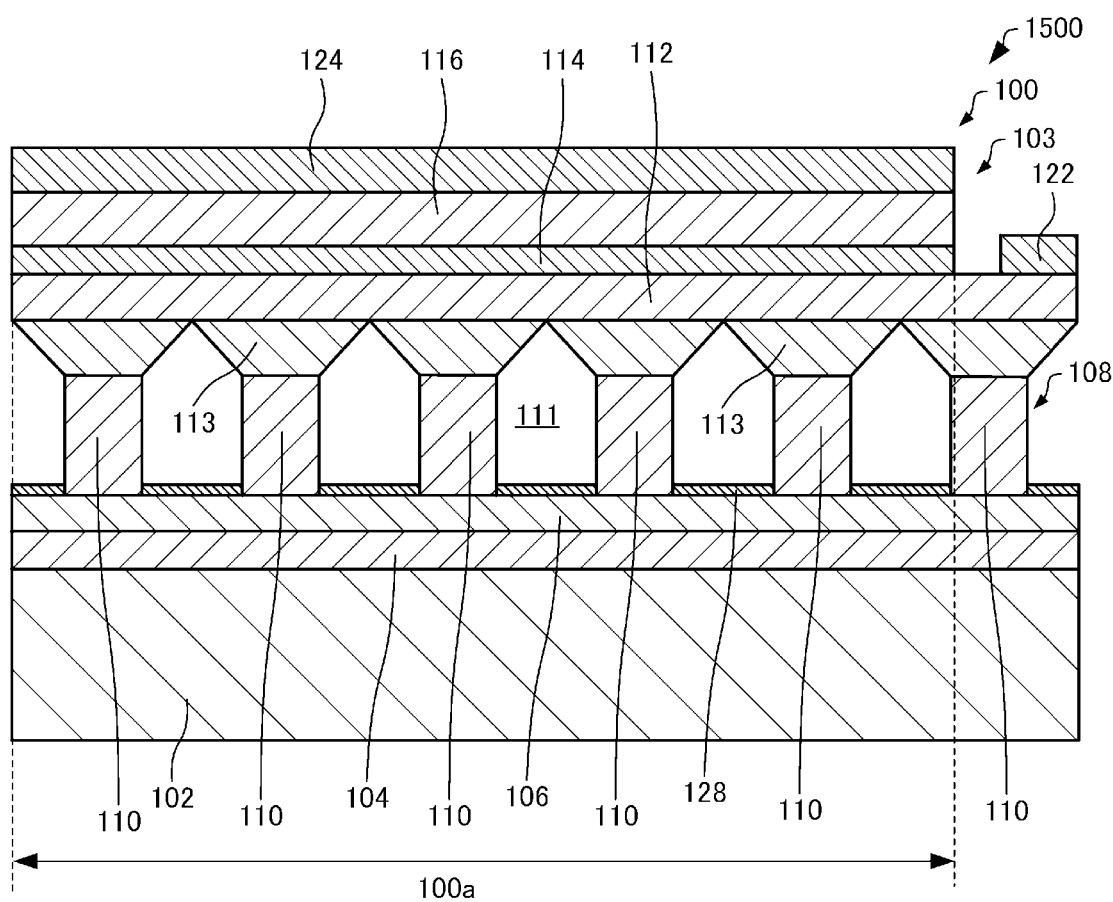
FIG. 10 is a diagram schematically showing a laser source of a projector according to a fifth modified example of the first embodiment.

Then, a projector 1500 according to a fifth modified example of the first embodiment will be described with reference to the accompanying drawing. FIG. 10 is a cross-sectional view schematically showing a laser source 100 of the projector 1500 according to the fifth modified example of the first embodiment.

In the laser source 100 of the projector 1000 described above, the columnar parts 110 of the photonic crystal structure 108 each have the light emitting layer 114 as shown in FIG. 4.

In contrast, in the laser source 100 of the projector 1500, the columnar parts 110 do not have the light emitting layer 114 as shown in FIG. 10.

In the projector 1500, the material of the columnar parts 110 is, for example, Si-doped n-type GaN. The photonic crystal structure 108 is constituted by the columnar parts 110, and gaps 111 each located between the columnar parts 110 adjacent to each other. In the illustrated example, there is disposed a taper part 113 with the diameter gradually increasing in an upward direction on each of the columnar parts 110. The material of the taper part 113 is the same as that of the columnar part 110. It should be noted that the taper parts 113 are not required to be disposed.

The semiconductor layer 112 is disposed above the taper parts 113. The light emitting layer 114 is disposed on the semiconductor layer 112. The semiconductor layer 116 is disposed on the light emitting layer 114. The first electrode 122 is disposed on the semiconductor layer 112. The second electrode 124 is disposed on the semiconductor layer 116. In the projector 1500, the light emitting section 100a corresponds to the light emitting layer 114. It should be noted that although not shown in the drawing, it is also possible for the semiconductor layers 112, 116 and the light emitting layer 114 to be disposed between the substrate 102 and the photonic crystal structure 108.

When the photonic crystal structure 108 does not have the light emitting layer 114 as in the projector 1500, the light leaked from the light emitting layer 114 toward the photonic crystal structure 108 is confined in a direction perpendicular to the stacking direction, and is emitted in the stacking direction.

2. Second Embodiment

Figure 11:
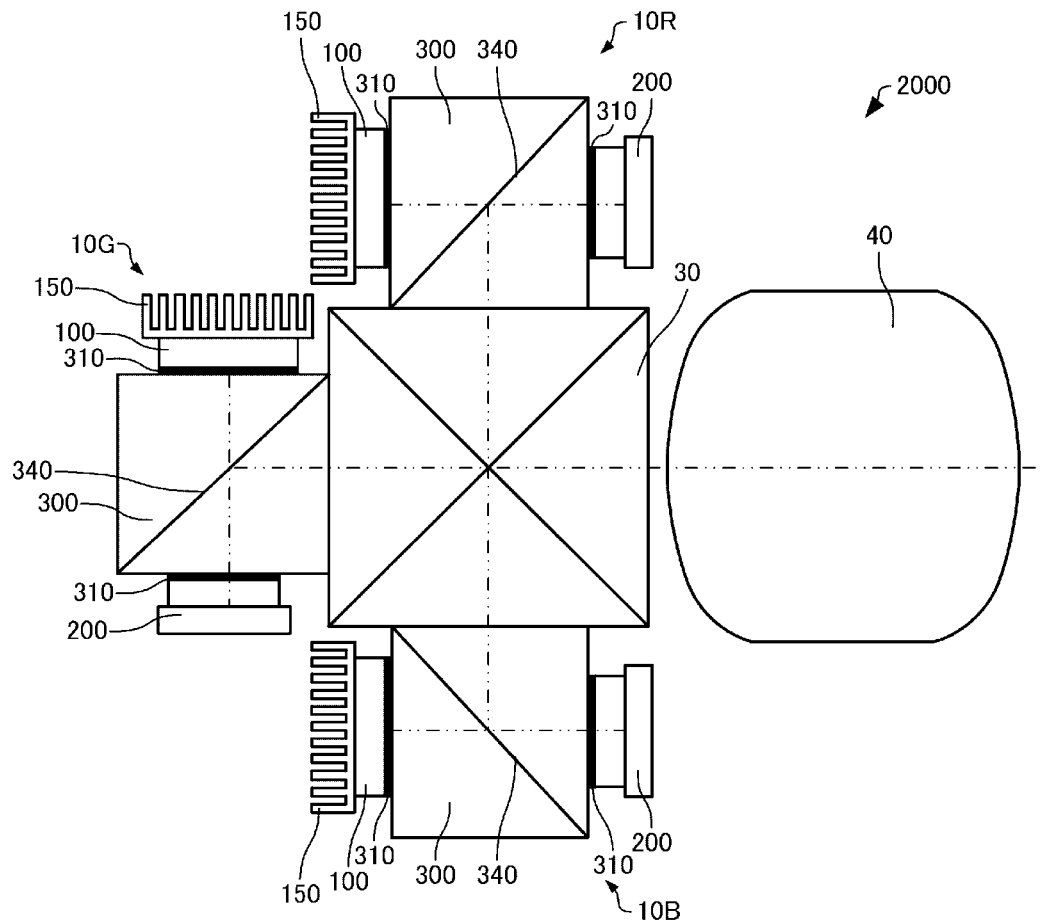
FIG. 11 is a diagram schematically showing a projector according to a second embodiment.
Figure 12:
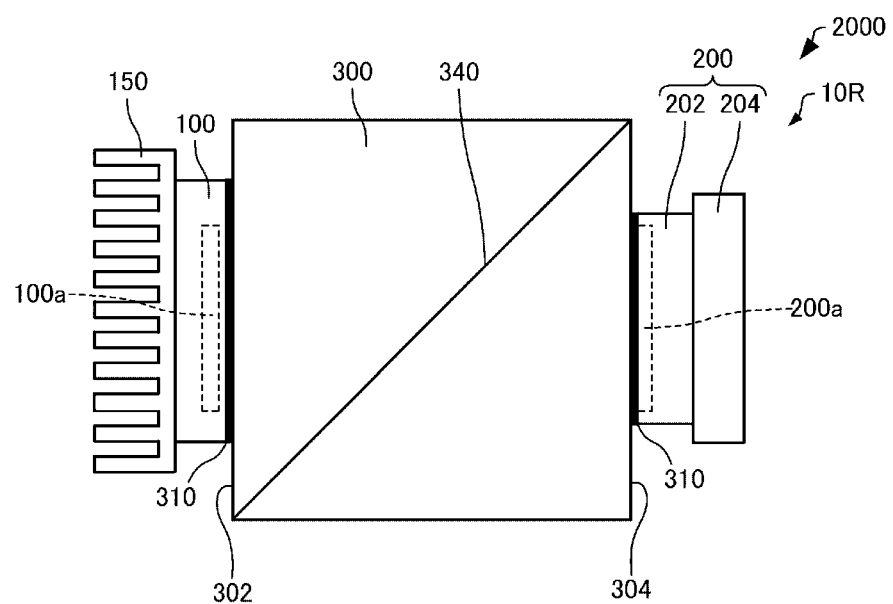
FIG. 12 is a diagram schematically showing a display device of the projector according to the second embodiment.

Then, a projector according to a second embodiment will be described with reference to the accompanying drawings. FIG. 11 is a diagram schematically showing the projector 2000 according to the second embodiment. FIG. 12 is a diagram schematically showing a display device 10R of the projector 2000 according to the second embodiment.

Hereinafter, in the projector 2000 according to the second embodiment, the points in which the projector 2000 is different from the projector 1000 according to the first embodiment described above will be described, and the description of the points in which the projectors are substantially the same will be omitted.

In the projector 1000 described above, the light modulation elements 200 are the transmissive type liquid crystal light valves for transmitting the light emitted from the laser sources 100 as shown in FIG. 1 and FIG. 2.

In contrast, in the projector 2000 described above, the light modulation element 200 is a reflective type liquid crystal light valve for reflecting the light emitted from the laser source 100 as shown in FIG. 11 and FIG. 12. The projector 2000 is an LCoS (Liquid Crystal on Silicon) projector.

In the projector 2000, the light transmissive member 300 is a polarization split element, and is specifically a polarization beam splitter. The polarization beam splitter is an optical element configured to sandwich a polarization split film 340 with tilted surfaces of a pair of rectangular prisms made of glass. The polarization split element transmits specific linearly-polarized light, for example, P-polarized light with respect to the polarization split film 340, and reflects linearly-polarized light having the polarization direction perpendicular to the specific linearly-polarized light, for example, S-polarized light with respect to the polarization split film 340. The polarization split element spatially separates the illumination light entering the light modulation element 200 and the image light emitted from the light modulation element 200 from each other using this function.

The linearly-polarized light high in polarization degree is emitted from the laser source 100, and the polarization direction of the linearly-polarized light is set so as to be P-polarized light with respect to the polarization split film 340. The P-polarized light emitted from the laser source 100 transmits through the polarization split film 340 of the polarization split element, and enters the light modulation element 200. Since the polarized light which has a little possibility of existence and which is different from the P-polarized light is reflected by the polarization split film 340, the P-polarized light alone enters the light modulation element 200. The light having entered the light modulation element 200 is converted into the S-polarized light due to the light modulation action to form the image light, reflected in the opposite direction to the direction at the incidence, and is then emitted from the light modulation element 200. The image light as the S-polarized light having been emitted from the light modulation element is reflected by the polarization split film 340, and is then emitted from the polarization split element with the proceeding direction folded as much as 90°.

In the projector 2000, the light transmissive member 300 disposed in the light path between the laser source 100 and the light modulation element 200 is the polarization split element. Since no lens is disposed between the laser source 100 and the light modulation element 200, it is possible to achieve the reduction in size. Further, due to the polarization split element, it is possible to split the light emitted from the laser source 100 into, for example, the P-polarized light and the S-polarized light.

3. Third Embodiment

3.1. Projector

Figure 13:
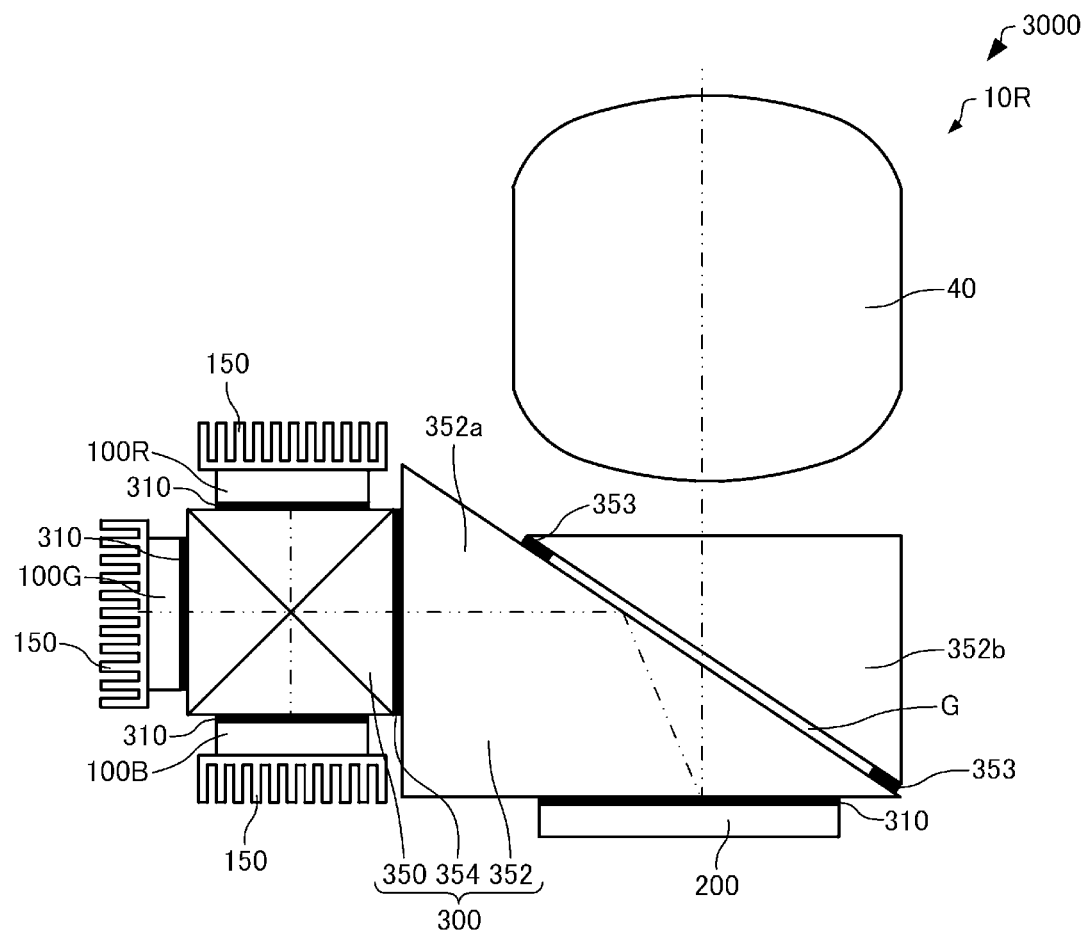
FIG. 13 is a diagram schematically showing a projector according to a third embodiment.

Then, a projector according to a third embodiment will be described with reference to the accompanying drawings. FIG. 13 is a diagram schematically showing the projector 3000 according to the third embodiment.

Hereinafter, in the projector 3000 according to the third embodiment, the points in which the projector 3000 is different from the projector 1000 according to the first embodiment described above will be described, and the description of the points in which the projectors are substantially the same will be omitted.

In the projector 1000 described above, the light modulation element 200 is the transmissive type liquid crystal light valve for transmitting the light emitted from the laser sources 100 as shown in FIG. 2.

In contrast, in the projector 3000, the light modulation element 200 is a DMD (Digital Micromirror Device; registered trademark) for reflecting the light emitted from the laser sources 100 as shown in FIG. 13. The DMD is a light modulation element provided with a number of micromirrors and controlling the emission direction of the reflected light by individually turning the micromirrors. The projector 3000 is a DLP (Digital Light Processing; registered trademark) projector.

In the projector 3000, the light transmissive member 300 has a colored light combining prism 350 and a total-reflection prism 352.

Laser sources 100R, 100G, and 100B are bonded to the colored light combining prism 350. In the illustrated example, the laser sources 100R, 100G, and 100B are bonded to the colored light combining prism 350 with the adhesive 310. The laser source 100R emits the red light similarly to the laser source 100 of the display device 10R shown in FIG. 1. The laser source 100G emits the green light similarly to the laser source 100 of the display device 10G shown in FIG. 1. The laser source 100B emits the blue light similarly to the laser source 100 of the display device 10B shown in FIG. 1.

The colored light combining prism 350 combines the light emitted from the laser source 100R, the light emitted from the laser source 100G, and the light emitted from the laser source 100B with each other similarly to the colored light combining prism 30 shown in FIG. 1.

In the example shown in FIG. 13, the light transmissive member 300 has an adhesive 354, and the total-reflection prism 352 is coupled to the colored light combining prism 350 with the adhesive 354. The adhesive 354 is, for example, the same adhesive as the adhesive 310.

The total-reflection prism 352 has a first prism 352a and a second prism 352b made of glass, and the first prism 352a and the second prism 352b are integrally fixed via a spacer 353. Between the first prism 352a and the second prism 352b, there is disposed an air gap G. The light emitted from the colored light combining prism 350 enters the first prism 352a, and is then totally reflected by the air gap G to enter the light modulation element 200. The light modulation element 200 is coupled to the total-reflection prism 352 with the adhesive 310. The light modulated in the light modulation element 200 is transmitted through the total-reflection prism 352, and then enters the projection lens 40.

In the projector 3000, since the light transmissive member 300 disposed in the light path between the laser source 100 and the light modulation element 200 has the colored light combining prism and the total-reflection prism, and no lens is disposed between the laser source 100 and the light modulation element 200, the reduction in size can be achieved.

Figure 14:
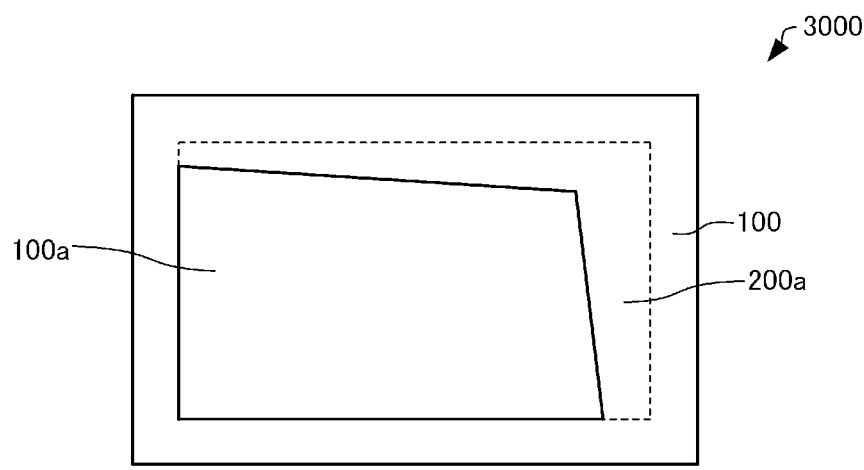
FIG. 14 is a diagram schematically showing a laser source of the projector according to the third embodiment.

Further, when illuminating the light modulation element 200, the light enters the light modulation element 200 from an oblique direction with respect to the normal line of the display area 200a of the light modulation element 200. In this case, the upper surface of the light emitting section 100a of the laser source 100 and the display area 200a are in a nonparallel arrangement relationship. Therefore, even when the light emitting section 100a has the same rectangular shape as that of the display area 200a when viewed from the stacking direction, the illumination area in the display area 200a is deformed into a non-rectangular shape. Therefore, it is preferable to adopt the shape and the size of the light emitting section 100a taking the deformation of the shape of the light in the oblique illumination into consideration when viewed from the stacking direction as shown in FIG. 14. It should be noted that FIG. 14 is a diagram schematically showing the laser source 100 from the proceeding direction of the light emitted from the laser source 100. Further, in FIG. 14, the laser source 100 is simplified, and the display area 200a of the light modulation element 200 is also illustrated. It should be noted that the matters described above are also applied to a projector 3100 described later.

3.2. Modified Examples

Figure 15:
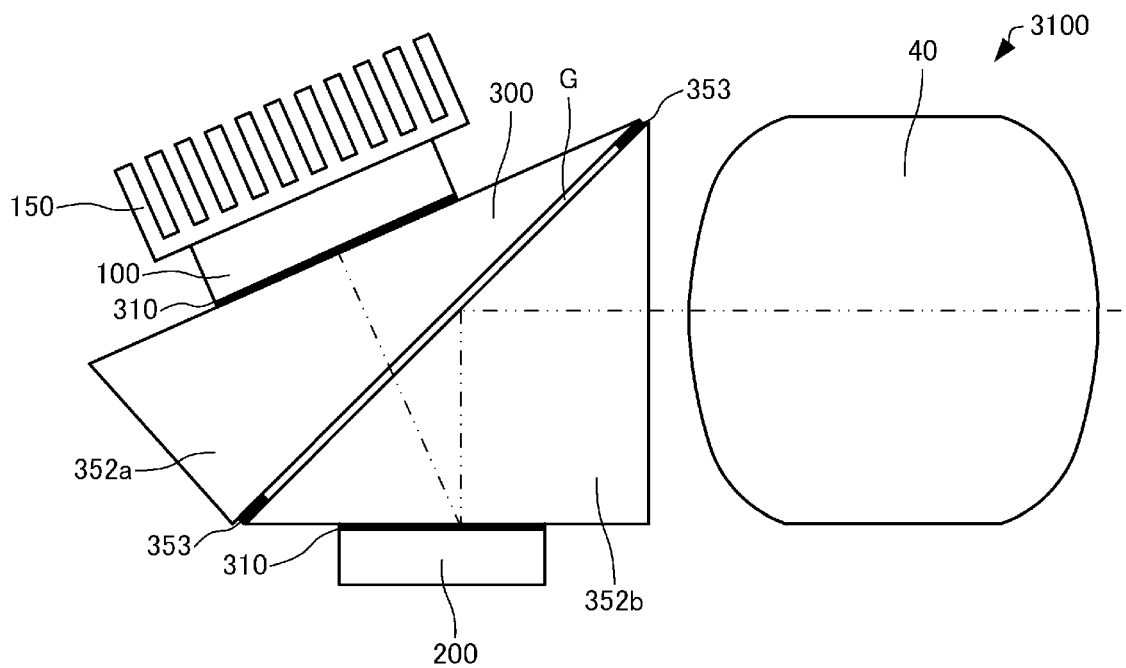
FIG. 15 is a diagram schematically showing a projector according to a modified example of the third embodiment.

Then, a projector according to a modified example of the third embodiment will be described with reference to the accompanying drawing. FIG. 15 is a diagram schematically showing the projector 3100 according to the modified example of the third embodiment.

Hereinafter, in the projector 3100 according to the modified example of the third embodiment, the points in which the projector 3100 is different from the projector 3000 according to the third embodiment described above will be described, and the description of the points in which the projectors are substantially the same will be omitted.

The projector 3000 described above has the three laser sources 100R, 100G, and 100B as shown in FIG. 13.

In contrast, in the projector 3100, there is provided a single laser source 100 as shown in FIG. 15. The light emitting section 100a of the laser source 100 has three types of parts which are different in emission wavelength from each other, and light emission of which can independently be controlled. Further, each of the three types of parts has, for example, a plurality of sub-light emitting sections each having a size of several tens of micrometers, and those sub-light emitting sections are regularly arranged in a plane. By the sub-light emitting section emitting light, the three types of parts respectively emit the red light, the green light, and the blue light. The laser source 100 emits the three types of light in a time-sharing manner. Further, in the projector 3100, the light transmissive member 300 is the total-reflection prism.

It should be noted that the light emitted from the laser source 100 has a radiation angle which is not 0°, but extremely small, and is slightly diffused. Therefore, the sub-light emitting sections adjacent to each other for emitting the light the same in color in the laser source 100 are disposed at a distance of, for example, several tens of micrometers, but the light emitted from the sub-light emitting sections adjacent to each other is moderately mixed in the stage of entering the light modulation element 200. Therefore, it is possible to evenly illuminate the display area 200a of the light modulation element 200.

In the projector 3100, the light transmissive member 300 disposed in the light path between the laser source 100 and the light modulation element 200 is the total-reflection prism. Since no lens is disposed between the laser source 100 and the light modulation element 200, it is possible to achieve the reduction in size.

The present disclosure can be implemented with some of the constituents omitted, or combining any of the embodiments and the modified examples with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages or configurations capable of achieving the same object as that of the configurations explained in the description of the embodiments. Further, the present disclosure includes configurations obtained by adding a known technology to the configuration explained in the description of the embodiments.

What is claimed is:

1. A projector comprising:
    a laser source including a light emitting section;
    a light modulation element configured to modulate light emitted from the laser source in accordance with image information; and
    a frame disposed between the laser source and the light modulation element, wherein
    the frame includes:
        a first surface that is coupled to the laser source; and
        a second surface that is coupled to the light modulation element,
    the laser source includes:
        a substrate; and
        a laminated structure provided to the substrate, and having a light emitting layer configured to emit light,
    the laminated structure constitutes a photonic crystal structure configured to confine the light emitted by the light emitting layer in an in-plane direction of the substrate, and emit the light emitted by the light emitting layer in a normal direction of the substrate, and
    the first surface of the frame is coupled to the light source in an area other than an area where the light emitting section is provided when viewed from the normal direction of the substrate.

2. The projector according to claim 1, wherein the laser source and the first surface are bonded to each other with interface bonding.

3. The projector according to claim 1, wherein the light modulation element and the second surface are bonded to each other with interface bonding.

4. The projector according to claim 1, wherein the laser source and the first surface are bonded to each other with an adhesive that includes a metal filler.

5. The projector according to claim 1, wherein the light modulation element and the second surface are bonded to each other with an adhesive that includes a metal filler.

* * * * *